United States Patent
Lei et al.

(10) Patent No.: US 10,661,383 B2
(45) Date of Patent: May 26, 2020

(54) MITIGATION OF PARTICLE CONTAMINATION FOR WAFER DICING PROCESSES

(71) Applicant: Applied Materials, Inc., Santa Clara, CA (US)

(72) Inventors: Wei-Sheng Lei, San Jose, CA (US); Jungrae Park, Santa Clara, CA (US); Ajay Kumar, Cupertino, CA (US); Brad Eaton, Menlo Park, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/439,553

(22) Filed: Jun. 12, 2019

(65) Prior Publication Data
US 2019/0291206 A1    Sep. 26, 2019

Related U.S. Application Data

(62) Division of application No. 15/611,015, filed on Jun. 1, 2017, now Pat. No. 10,363,629.

(51) Int. Cl.
*H01L 21/00* (2006.01)
*B23K 26/0622* (2014.01)
(Continued)

(52) U.S. Cl.
CPC ...... *B23K 26/0624* (2015.10); *B23K 26/0661* (2013.01); *B23K 26/18* (2013.01);
(Continued)

(58) Field of Classification Search
CPC .............. B23K 26/0624; B23K 26/364; B23K 26/0661; B23K 26/18; B23K 26/402;
(Continued)

(56) References Cited

U.S. PATENT DOCUMENTS 4,049,944 A   9/1977   Garvin et al.
4,339,528 A   7/1982   Goldman
(Continued)

FOREIGN PATENT DOCUMENTS

JP          9216085      8/1997
JP       2001/127011     5/2001
(Continued)

OTHER PUBLICATIONS

Linder V. et al., "Water-Soluble Sacrificial Layer for Surface Micromachining," www.small-journal.com, 2005, 1, No. 7, 7 pgs.
(Continued)

*Primary Examiner* — Richard A Booth
(74) *Attorney, Agent, or Firm* — Schwabe, Williamson & Wyatt, P.C.

(57) ABSTRACT

Methods of dicing semiconductor wafers are described. In an example, a method of dicing a wafer having a plurality of integrated circuits thereon involves dicing the wafer into a plurality of singulated dies disposed above a dicing tape. The method also involves forming a material layer over and between the plurality of singulated dies above the dicing tape. The method also includes expanding the dicing tape, wherein a plurality of particles is collected on the material layer during the expanding.

5 Claims, 9 Drawing Sheets

(51) Int. Cl.
| | |
|---|---|
| *H01L 21/683* | (2006.01) |
| *H01L 21/78* | (2006.01) |
| *H01L 21/67* | (2006.01) |
| *B23K 26/06* | (2014.01) |
| *B23K 26/18* | (2006.01) |
| *B23K 26/402* | (2014.01) |
| *B23K 26/364* | (2014.01) |
| *H01L 21/02* | (2006.01) |
| *H01L 21/3065* | (2006.01) |
| *H01L 21/308* | (2006.01) |
| *B23K 101/42* | (2006.01) |
| *B23K 103/00* | (2006.01) |

(52) U.S. Cl.
CPC .......... *B23K 26/364* (2015.10); *B23K 26/402* (2013.01); *H01L 21/02057* (2013.01); *H01L 21/3065* (2013.01); *H01L 21/3081* (2013.01); *H01L 21/67092* (2013.01); *H01L 21/67132* (2013.01); *H01L 21/6836* (2013.01); *H01L 21/78* (2013.01); *B23K 2101/42* (2018.08); *B23K 2103/50* (2018.08); *B23K 2103/56* (2018.08); *H01L 2221/68327* (2013.01); *H01L 2221/68336* (2013.01); *H01L 2221/68381* (2013.01)

(58) Field of Classification Search
CPC ......... H01L 21/67092; H01L 21/67132; H01L 21/6836; H01L 21/78
See application file for complete search history.

(56) References Cited

U.S. PATENT DOCUMENTS

| | | | |
|---|---|---|---|
| 4,684,437 A | 8/1987 | Donelon et al. |
| 5,336,638 A | 8/1994 | Suzuki et al. |
| 5,593,606 A | 1/1997 | Owen et al. |
| 5,691,794 A | 11/1997 | Hoshi et al. |
| 6,051,503 A | 4/2000 | Bhardwaj et al. |
| 6,057,180 A | 5/2000 | Sun et al. |
| 6,174,271 B1 | 1/2001 | Kosmowski |
| 6,300,593 B1 | 10/2001 | Powell |
| 6,306,731 B1 | 10/2001 | Igarashi et al. |
| 6,407,363 B2 | 6/2002 | Dunsky et al. |
| 6,426,275 B1 | 7/2002 | Arisa |
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu |
| 7,361,990 B2 | 4/2008 | Lu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,638 B2 | 3/2009 | Mancini et al. |
| 7,507,639 B2 | 3/2009 | Nakamura |
| 7,629,228 B2 | 12/2009 | Haji et al. |
| 7,659,140 B2 * | 2/2010 | Lee ............ H01L 21/3043 257/110 |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,804,043 B2 | 9/2010 | Deshi |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,926,410 B2 | 4/2011 | Bair |
| 7,927,973 B2 | 4/2011 | Haji et al. |
| 8,940,619 B2 | 1/2015 | Lei et al. |
| 2003/0162313 A1 | 8/2003 | Kim et al. |
| 2004/0080045 A1 | 4/2004 | Kimura et al. |
| 2004/0137700 A1 | 7/2004 | Sekiya |
| 2004/0157457 A1 | 8/2004 | Xu et al. |
| 2004/0212047 A1 | 10/2004 | Joshi et al. |
| 2006/0043535 A1 | 3/2006 | Hiatt |
| 2006/0086898 A1 | 4/2006 | Cheng et al. |
| 2006/0088984 A1 | 4/2006 | Li et al. |
| 2006/0146910 A1 | 7/2006 | Koochesfahani et al. |
| 2006/0205182 A1 | 9/2006 | Soejima |
| 2007/0207594 A1 | 9/2007 | Tamura |
| 2009/0255911 A1 | 10/2009 | Krishnaswami et al. |
| 2010/0013036 A1 | 1/2010 | Carey |
| 2010/0216313 A1 | 8/2010 | Iwai et al. |
| 2010/0248451 A1 | 9/2010 | Pirogovsky et al. |
| 2010/0273312 A1 | 10/2010 | Noda |
| 2011/0014777 A1 | 1/2011 | Haji et al. |
| 2011/0312157 A1 | 12/2011 | Lei et al. |
| 2012/0199993 A1 | 8/2012 | Yoshimura et al. |
| 2013/0045554 A1 | 2/2013 | Yamazaki |
| 2013/0065378 A1 | 3/2013 | Johnson et al. |
| 2013/0230972 A1 | 9/2013 | Johnson et al. |
| 2013/0299088 A1 | 11/2013 | Lei et al. |
| 2017/0278801 A1 | 9/2017 | Park et al. |

FOREIGN PATENT DOCUMENTS

| | | |
|---|---|---|
| JP | 2001/144126 | 5/2001 |
| JP | 2003/179005 | 5/2001 |
| JP | 10321908 | 5/2001 |
| JP | 2004/031526 | 1/2004 |
| JP | 2004/055684 | 2/2004 |
| LR | 10-2011-0038339 | 4/2011 |
| WO | WO 03036712 | 5/2003 |
| WO | WO 03071591 | 8/2003 |

OTHER PUBLICATIONS

Sing, Saravjeet, et al., "Apparatus and Methods for Dry Etch With Edge, Side and Back Protection," U.S. Appl. No. 61/491,693, filed May 31, 2011 24 pgs.
International Search Report and Written Opinion from PCT/US20118/032452 dated Sep. 5, 2018, 11 pgs.
International Preliminary Report on Patentability from PCT/US2018/032452 dated Dec. 12, 2019, 8 pgs.

* cited by examiner

MITIGATION OF PARTICLE CONTAMINATION FOR WAFER DICING PROCESSES

CROSS-REFERENCE TO RELATED APPLICATIONS

This application is a divisional of U.S. patent application Ser. No. 15/611,015, filed on Jun. 1, 2017, the entire contents of which are hereby incorporated by reference herein.

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a method of dicing a wafer having a plurality of integrated circuits thereon involves dicing the wafer into a plurality of singulated dies disposed above a dicing tape. The method also involves forming a material layer over and between the plurality of singulated dies above the dicing tape. The method also includes expanding the dicing tape, wherein a plurality of particles is collected on the material layer during the expanding.

In an embodiment, a method of dicing a wafer having a plurality of integrated circuits thereon involves forming a water soluble mask layer above the wafer, the wafer disposed above a dicing tape, the dicing tape housed in a frame. The method also involves scribing the water soluble mask layer with a laser scribing process to expose portions of the wafer. The method also involves etching the exposed portions of the wafer with a plasma process to dice the wafer into a plurality of singulated dies. The method also involves forming a water soluble protecting layer over and between the plurality of singulated dies above the dicing tape. The method also involves removing the dicing tape from the frame. The method also involves, subsequent to removing the dicing tape from the frame, expanding the dicing tape, wherein a plurality of particles is collected on the water soluble material layer during the expanding. The method also involves, subsequent to expanding the dicing tape, removing the water soluble protecting layer and remaining portions of the water soluble mask layer with an aqueous medium.

In an embodiment, an apparatus includes a plurality of singulated dies disposed above a dicing tape. A water soluble material layer is disposed over and between the plurality of singulated dies above the dicing tape. A plurality of particles is on the water soluble material layer.

DETAILED DESCRIPTION

Methods of dicing semiconductor wafers are described. In the following description, numerous specific details are set forth, such as femtosecond-based laser scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

One or more embodiments described herein is directed to a dicing approach that advantageously mitigates or altogether avoids particle contamination of semiconductor dies.

To provide context, many semiconductor chips such as microelectromechanical sensors (MEMS) are very sensitive to particle contamination or damage throughout the wafer fab and packaging processes. A potential such concern is associated with the wafer dicing process. If the wafer dicing process end points as dicing-through-trenches that stop inside the wafer (FIG. 1), during the phase of diced wafer/tape expansion for die picking, the portion of the wafer edge that is not diced there through such as point can break and generate particles of wafer material that may randomly hit an exposed device of one of the singulated dies, leading to lower yield. Unfortunately, for a laser scribe and plasma etching hybrid dicing process, due to the much lower resistance of the dicing tape to laser ablation and plasma etch compared to the wafer materials, the end points of laser scribe typically must end point on the wafer to avoid dicing tape damage.

Figure 1:
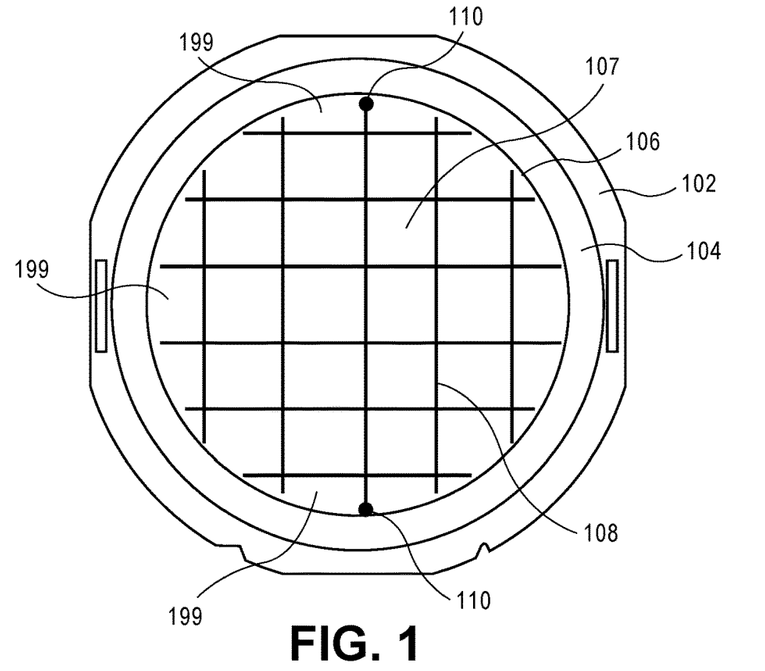
FIG. 1 illustrates a supported wafer having scribe lines within a perimeter of the wafer, in accordance with an embodiment of the present invention.

FIG. 1 illustrates a supported wafer having scribe lines within a perimeter of the wafer, in accordance with an embodiment of the present invention.

Referring to FIG. 1, a substrate support frame 102 includes a dicing tape 104 therein. A wafer 106 is supported on the dicing tape, within the frame 102. The wafer 106 includes individual dies 107. The individual dies 107 are singulated by scribing (dicing) the wafer 106. The scribing is performed along scribe lines 108, which terminate at end points 110 within a perimeter of the wafer 106. The scribing leaves non-scribed portions 199, which may be in the form of a continuous ring as depicted.

By end-point at locations 110 within the perimeter of the wafer 106, damage to the dicing tape 104 may be avoided. Reasons to avoid tape damage at the scribing phase may be manifold. Fundamentally, if the dicing tape 104 is punched through, the required vacuum condition for plasma etch of the wafer and for subsequent tape expansion of the diced wafer cannot be satisfied. From a plasma etch viewpoint, exposure of dicing tape 104 to a plasma during wafer etch also needs to be avoided for a similar reason. This situation may present a challenge unique to a laser scribe and plasma etch hybrid dicing technology.

By contrast, for conventional blade dicing dominated processes, the above concerns are addressed by allowing the blade to cut across the whole wafer and stop on the dicing tape on both ends. As an example, FIG. 2 illustrates a supported wafer having scribe lines that extend outside of a perimeter of the wafer, in accordance with an embodiment of the present invention.

Figure 2:
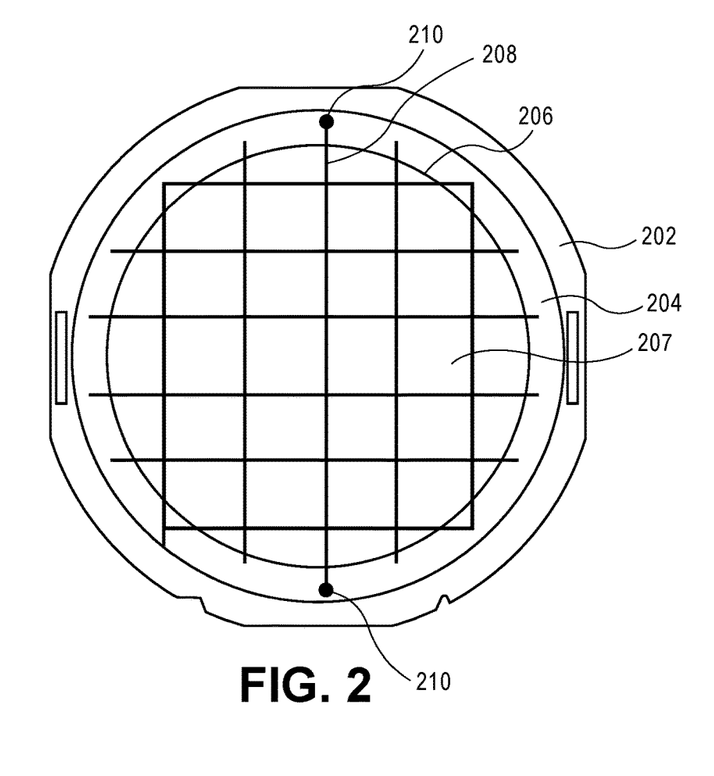
FIG. 2 illustrates a supported wafer having scribe lines that extend outside of a perimeter of the wafer, in accordance with an embodiment of the present invention.

Referring to FIG. 2, a substrate support frame 202 includes a dicing tape 204 therein. A wafer 206 is supported on the dicing tape, within the frame 202. The wafer 206 includes individual dies 207. The individual dies 207 are singulated by scribing (dicing) the wafer 206. The sawing is performed along scribe lines 208, which terminate at end points 210 outside of a perimeter of the wafer 206. Although such a process eliminates the formation of a continuous ring 199, there are numerous reasons that a laser scribing/plasma etching approach is preferred over a blade dicing approach, such as one or more of the reasons described in the present disclosure.

Accordingly, in an embodiment, a laser scribe and plasma etch hybrid dicing approach is employed for die singulation. However, the process involves initial laser scribing that terminates within a perimeter of a wafer, such as described in association with FIG. 1. At die pick, the dicing tape is expanded and, in an embodiment, breaks the continuous ring 199 surrounding the singulated dies. Breaking the continuous ring 199 generates particles which may be of a nature that could harm one or more of the singulated dies. One or more embodiments described herein provide an approach to mitigate or altogether avoid damage to a singulated die from particles generated during such a dicing tape expansion process.

In an particular embodiment, an approach to mitigate or altogether avoid damage to a singulated die from particles generated during a dicing tape expansion process involves first mounting a wafer on a dicing tape, the dicing tape supported by a frame. A mask is applied on the wafer. Laser scribing is performed and is end-pointed with a perimeter of the wafer. A plasma etch process completes the singulation initiated by the laser scribing. A mask layer is coated on the singulated/diced wafer (either on the singulated dies only, or on all remaining portions of the wafer). The extent of coating may depend on how much of the dicing mask remains and/or whether or not sidewalls of the dies should be protected. Dicing tape expansion is then performed to separate dies and connected areas on the wafer edge. In one embodiment, particles are generated and are collected on top of the coated mask layer. Wafer cleaning may then be performed to remove the coated mask and the particles thereon. Further processing may include UV curing of the dicing tape followed by tape expansion and die pick.

In an embodiment, the above process implements a post dicing mask to protect singulated dies during a tape expansion process, where the post dicing mask collects particles as opposed to generated particles damaging the singulated dies. In one embodiment, only the singulated dies are coated with the post dicing mask, and particles generated upon cracking or breaking a continuous outer ring of the wafer are captured on the surface of the post dicing mask over the singulated dies. In another embodiment, both the singulated dies and a remaining surrounding continuous outer ring of the wafer are coated with the post dicing mask, and particles generated upon cracking or breaking the continuous outer ring of the wafer are trapped under the post dicing mask portion over the continuous outer ring the singulated dies.

In one aspect, a hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing.

Conventional wafer dicing approaches include diamond saw cutting based on a purely mechanical separation, initial laser scribing and subsequent diamond saw dicing, or nanosecond or picosecond laser dicing. For thin wafer or substrate singulation, such as 50 microns thick bulk silicon singulation, the conventional approaches have yielded only poor process quality. Some of the challenges that may be faced when singulating die from thin wafers or substrates may include microcrack formation or delamination between different layers, chipping of inorganic dielectric layers, retention of strict kerf width control, or precise ablation depth control. Embodiments of the present invention include a hybrid laser scribing and plasma etching die singulation approach that may be useful for overcoming one or more of the above challenges.

In accordance with an embodiment of the present invention, a combination of laser scribing, e.g., femtosecond-based laser scribing, and plasma etching is used to dice a semiconductor wafer into individualized or singulated integrated circuits. In one embodiment, femtosecond-based laser scribing is used as an essentially, if not totally, non-thermal process. For example, the femtosecond-based laser scribing may be localized with no or negligible heat damage zone. In an embodiment, approaches herein are used to singulated integrated circuits having ultra-low k films. With convention dicing, saws may need to be slowed down to accommodate such low k films. Furthermore, semiconductor wafers are now often thinned prior to dicing. As such, in an embodiment, a combination of mask patterning and partial wafer scribing with a femtosecond-based laser, followed by a plasma etch process, is now practical. In one embodiment, direct writing with laser can eliminate need for a lithography patterning operation of a photo-resist layer and can be implemented with very little cost. In one embodiment, through-via type silicon etching is used to complete the dicing process in a plasma etching environment.

Figure 3:
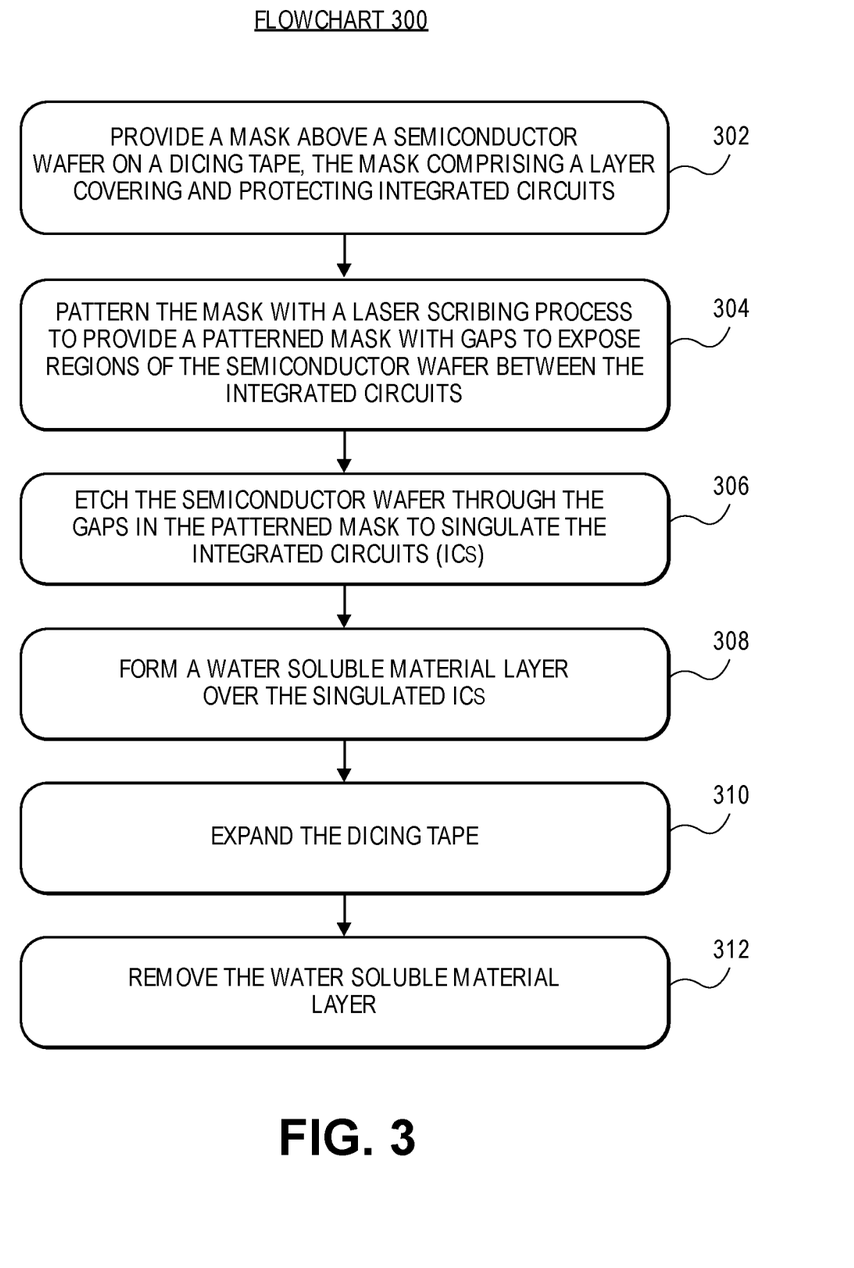
FIG. 3 is a Flowchart representing operations in a method of dicing a semiconductor wafer including a plurality of integrated circuits, in accordance with an embodiment of the present invention.

Thus, in an aspect of the present invention, a combination of femtosecond-based laser scribing and plasma etching may be used to dice a semiconductor wafer into singulated integrated circuits. As an example, FIG. 3 is a Flowchart 300 representing operations in a method of dicing a semiconductor wafer including a plurality of integrated circuits, in accordance with an embodiment of the present invention. FIGS. 4A-4F illustrate cross-sectional views of a semiconductor wafer including a plurality of integrated circuits during performing of a method of dicing the semiconductor wafer, corresponding to operations of Flowchart 300, in accordance with an embodiment of the present invention.

Figure 4A:
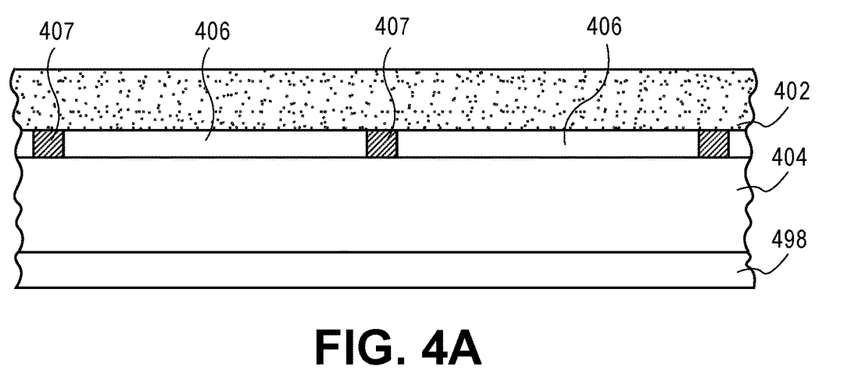
FIG. 4A-4F illustrate cross-sectional views of a semiconductor wafer including a plurality of integrated circuits during various operations in a method of dicing the semiconductor wafer, corresponding to the operations of the Flowchart of FIG. 3, in accordance with an embodiment of the present invention.

Referring to operation 302 of Flowchart 300, and corresponding FIG. 4A, a mask 402 is provided above a semiconductor wafer or substrate 404. The mask 402 is composed of a layer covering and protecting integrated circuits 406 formed on the surface of semiconductor wafer 404. The mask 402 also covers intervening streets 407 formed between each of the integrated circuits 406. The semiconductor wafer or substrate 404 is disposed on dicing tape 498. The dicing tape 498 as shown may be a portion of a framed dicing tape, e.g., framed by a metal or plastic, or other material, ring. Such a dicing tape may be referred to as being housed in a frame.

In accordance with an embodiment of the present invention, forming the mask 402 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultraviolet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate. However, in other embodiments, non-photo-sensitive and/or less costly materials are used as the mask 402. In an embodiment, the mask is formed by uniformly spinning on a mask above a semiconductor wafer, the mask including a layer covering and protecting bumps or pillars of the integrated circuits.

In an embodiment, semiconductor wafer or substrate 404 is composed of a material suitable to withstand a fabrication process and upon which semiconductor processing layers may suitably be disposed. For example, in one embodiment, semiconductor wafer or substrate 404 is composed of a group IV-based material such as, but not limited to, crystalline silicon, germanium or silicon/germanium. In a specific embodiment, providing semiconductor wafer 404 includes providing a monocrystalline silicon substrate. In a particular embodiment, the monocrystalline silicon substrate is doped with impurity atoms. In another embodiment, semiconductor wafer or substrate 404 is composed of a III-V material such as, e.g., a III-V material substrate used in the fabrication of light emitting diodes (LEDs).

In an embodiment, semiconductor wafer or substrate 404 has disposed thereon or therein, as a portion of the integrated circuits 406, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 406. Materials making up the streets 407 may be similar to or the same as those materials used to form the integrated circuits 406. For example, streets 407 may be composed of layers of dielectric materials, semiconductor materials, and metallization. In one embodiment, one or more of the streets 407 includes test devices similar to the actual devices of the integrated circuits 406.

Figure 4B:
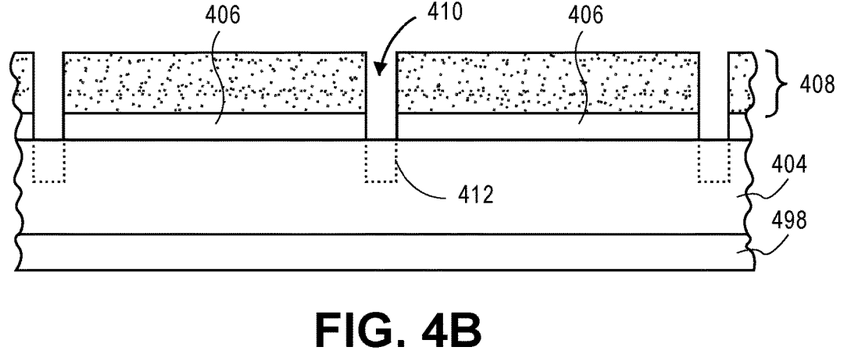

Referring to operation 304 of Flowchart 300, and corresponding FIG. 4B, the mask 402 is patterned with a laser scribing process to provide a patterned mask 408 with gaps 410, exposing regions of the semiconductor wafer or substrate 404 between the integrated circuits 406. As such, the laser scribing process is used to remove the material of the streets 407 originally formed between the integrated circuits 406. In accordance with an embodiment of the present invention, patterning the mask 402 with the laser scribing process includes forming trenches 412 partially into the regions of the semiconductor wafer 404 between the integrated circuits 406, as depicted in FIG. 4B.

In an embodiment, patterning the mask 406 with the laser scribing process includes using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 402, the streets 407 and, possibly, a portion of the semiconductor wafer or substrate 404.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 5 illustrates a cross-sectional view of a stack of materials that may be used in a street region of a semiconductor wafer or substrate, in accordance with an embodiment of the present invention.

Figure 5:
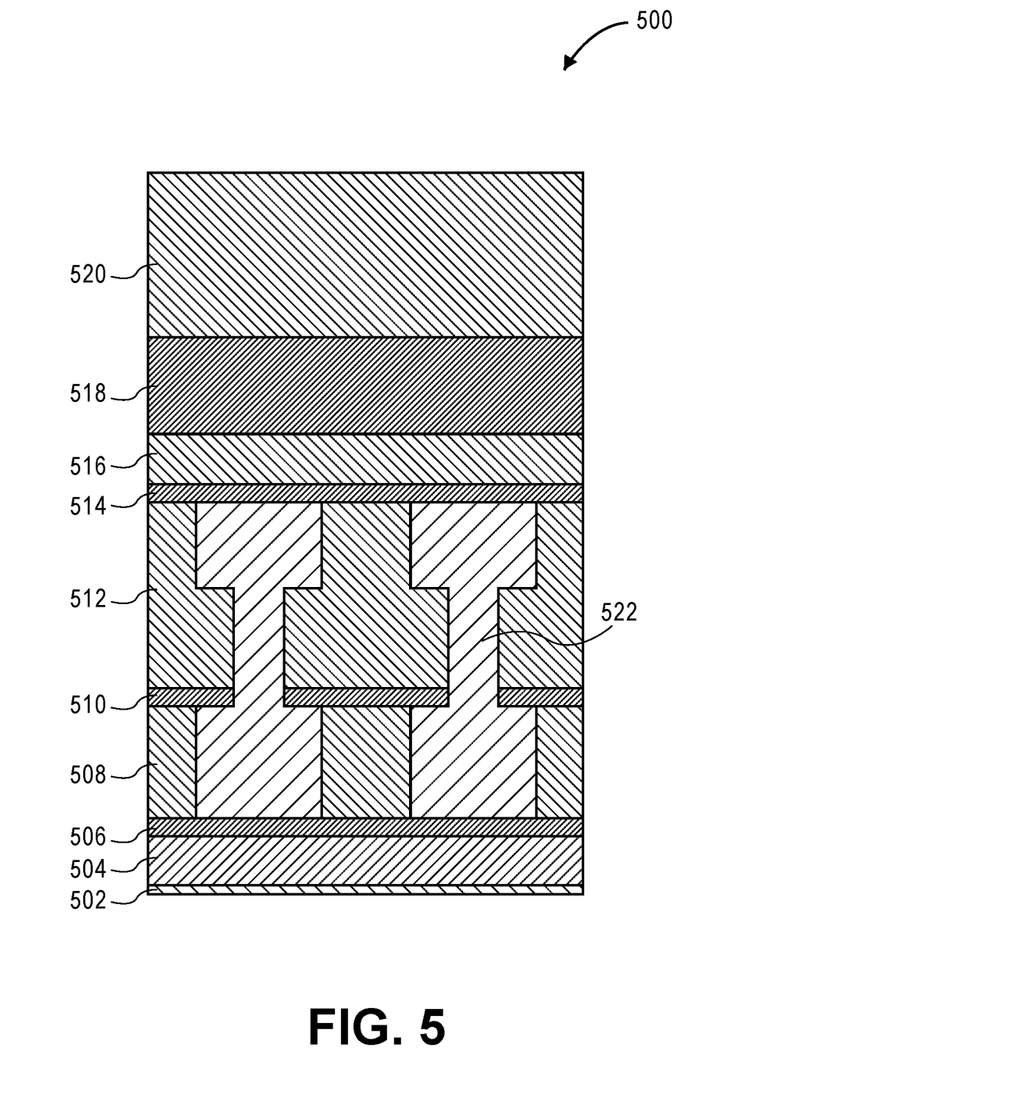
FIG. 5 illustrates a cross-sectional view of a stack of materials that may be used in a street region of a semiconductor wafer or substrate, in accordance with an embodiment of the present invention.

Referring to FIG. 5, a street region 500 includes the top portion 502 of a silicon substrate, a first silicon dioxide layer 504, a first etch stop layer 506, a first low K dielectric layer 508 (e.g., having a dielectric constant of less than the dielectric constant of 4.0 for silicon dioxide), a second etch stop layer 510, a second low K dielectric layer 512, a third etch stop layer 514, an undoped silica glass (USG) layer 516, a second silicon dioxide layer 518, and a layer of photoresist 520, with relative thicknesses depicted. Copper metallization 522 is disposed between the first and third etch stop layers 506 and 514 and through the second etch stop layer 510. In a specific embodiment, the first, second and third etch stop layers 506, 510 and 514 are composed of silicon nitride, while low K dielectric layers 508 and 512 are composed of a carbon-doped silicon oxide material.

Under conventional laser irradiation (such as nanosecond-based or picosecond-based laser irradiation), the materials of street 500 behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation.

In an embodiment, parameters for a femtosecond laser-based process may be selected to have an essentially common ablation effect on the inorganic and organic dielectrics, metals, and semiconductors even though the general energy absorption characteristics of such materials may differ widely under certain conditions. For example, the absorptivity of silicon dioxide is non-linear and may be brought more in-line with that of organic dielectrics, semiconductors and metals under the appropriate laser ablation parameters. In one such embodiment, a high intensity and short pulse width femtosecond-based laser process is used to ablate a stack of layers including a silicon dioxide layer and one or more of an organic dielectric, a semiconductor, or a metal. In a specific embodiment, pulses of approximately less than or equal to 400 femtoseconds are used in a femtosecond-based laser irradiation process to remove a mask, a street, and a portion of a silicon substrate.

By contrast, if non-optimal laser parameters are selected, in stacked structures that involve two or more of an inorganic dielectric, an organic dielectric, a semiconductor, or a metal, a laser ablation process may cause delamination issues. For example, a laser penetrate through high bandgap energy dielectrics (such as silicon dioxide with an approximately of 9 eV bandgap) without measurable absorption. However, the laser energy may be absorbed in an underlying metal or silicon layer, causing significant vaporization of the metal or silicon layers. The vaporization may generate high pressures to lift-off the overlying silicon dioxide dielectric layer and potentially causing severe interlayer delamination and microcracking. In an embodiment, while picoseconds-based laser irradiation processes lead to microcracking and delaminating in complex stacks, femtosecond-based laser irradiation processes have been demonstrated to not lead to microcracking or delamination of the same material stacks.

In order to be able to directly ablate dielectric layers, ionization of the dielectric materials may need to occur such that they behave similar to a conductive material by strongly absorbing photons. The absorption may block a majority of the laser energy from penetrating through to underlying silicon or metal layers before ultimate ablation of the dielectric layer. In an embodiment, ionization of inorganic dielectrics is feasible when the laser intensity is sufficiently high to initiate photon-ionization and impact ionization in the inorganic dielectric materials.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Figure 4C:
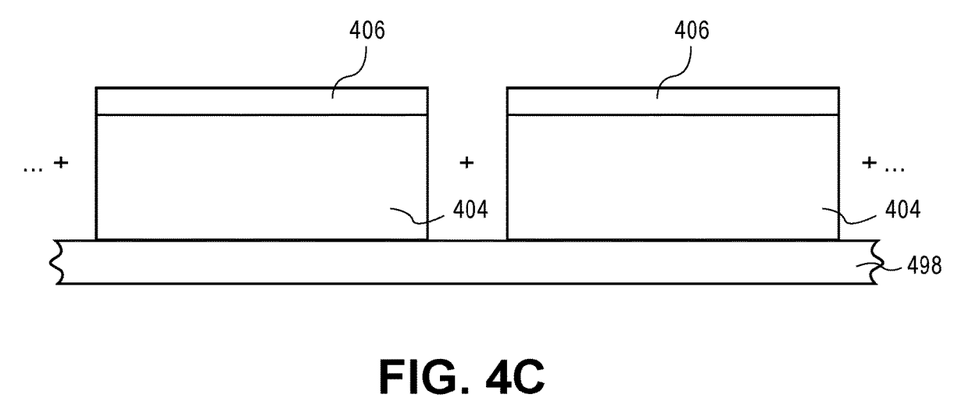

It is to be appreciated that the dicing or singulation process could be stopped after the above described laser scribing in a case that the laser scribing is used to pattern the mask as well as to scribe fully through the wafer or substrate in order to singulate the dies. In one such embodiment, the plasma etch process described below in association with FIG. 4C is omitted and the process begins again at the operation described in association with FIG. 4D. Accordingly, in an embodiment, further singulation processing such as plasma etching to effect singulation is not required. However, the embodiments that follow as described in association with FIG. 4C may be considered in cases where laser scribing alone is not implemented for total singulation.

In an optional embodiment, subsequent to the laser scribing process and prior to a plasma etching singulation process, an intermediate post mask-opening cleaning operation is performed. In an embodiment, the post mask-opening cleaning operation is a plasma-based cleaning process. In an example, as described below, the plasma-based cleaning process is non-reactive to the trenches 412 of the substrate 404 exposed by the gaps 410.

In accordance with one embodiment, the plasma-based cleaning process is non-reactive to exposed regions of the substrate 404 in that the exposed regions are not or only negligibly etched during the cleaning process. In one such embodiment, only non-reactive gas plasma cleaning is used. For example, Ar or another non-reactive gas (or the mix) is used to perform a highly-biased plasma treatment both for mask condensation and cleaning of scribed openings. The approach may be suitable for water-soluble masks such as mask 402. In another such embodiment, separate mask condensation (densification of the surface layer) and scribed trench cleaning operations are used, e.g., an Ar or non-reactive gas (or the mix) highly-biased plasma treatment for mask condensation is first performed, and then an Ar+$SF_6$ plasma cleaning of a laser scribed trench is performed. This embodiment may be suitable for cases where Ar-cleaning is not sufficient for trench cleaning due to too thick of a mask material.

Referring to operation 306 of Flowchart 300, and corresponding FIG. 4C, the semiconductor wafer 404 is etched through the gaps 410 in the patterned mask 408 to singulate the integrated circuits 406 (to form singulated dies). In accordance with an embodiment of the present invention, etching the semiconductor wafer 404 includes etching the trenches 412 formed with the femtosecond-based laser scribing process to ultimately etch entirely through semiconductor wafer 404, as depicted in FIG. 4C. In one such embodiment, the etching exposes portions of the dicing tape 498, as depicted in FIG. 4C.

In an embodiment, etching the semiconductor wafer 404 includes using a plasma etching process. In one embodiment, a through-silicon via type etch process is used. For example, in a specific embodiment, the etch rate of the material of semiconductor wafer 404 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 404 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which is generally a fluorine-based gas such as $SF_6$, $C_4F_8$, $CHF_3$, $XeF_2$, or any other reactant gas capable of etching silicon at a relatively fast etch rate. In an embodiment, the mask layer 408 is removed after the singulation process, as depicted in FIG. 4C. Furthermore, in an embodiment, the etching process and/or mask removal has little to no impact on the dicing tape 498, as depicted in FIG. 4C.

Figure 4D:
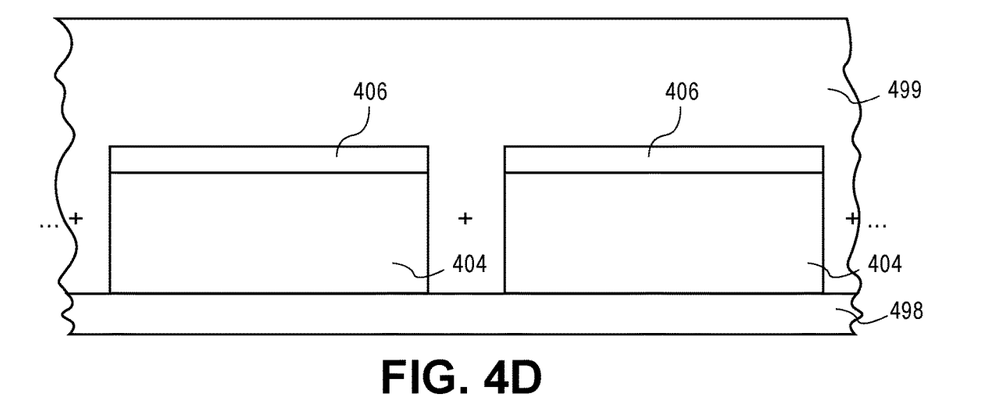

Referring to operation 308 of Flowchart 300, and corresponding FIG. 4D, a material layer 499 is formed over and between the plurality of singulated integrated circuits 406 (singulated dies) above the dicing tape 498. In an embodiment, only the singulated dies are coated. In another embodiment, both the singulated dies and a continuous ring (e.g., ring 199 described in association with FIG. 1) are coated with the material layer 499.

In one embodiment, the water soluble material layer is readily dissolvable in an aqueous media. For example, in one embodiment, the water-soluble material layer is composed of a material that is soluble in one or more of an alkaline solution, an acidic solution, or in deionized water. In one embodiment, the water-soluble material layer is composed of a material such as, but not limited to, polyvinyl alcohol, polyacrylic acid, dextran, polymethacrylic acid, polyethylene imine, or polyethylene oxide. In a specific embodiment, the water-soluble material layer has an etch rate in an aqueous solution approximately in the range of 1-15 microns per minute and, more particularly, approximately 1.3 microns per minute. In another specific embodiment, the water-soluble material layer is formed by a spin-on technique. In an alternative embodiment, the material layer 499 is a non-water-soluble polymer layer.

Figure 4E:
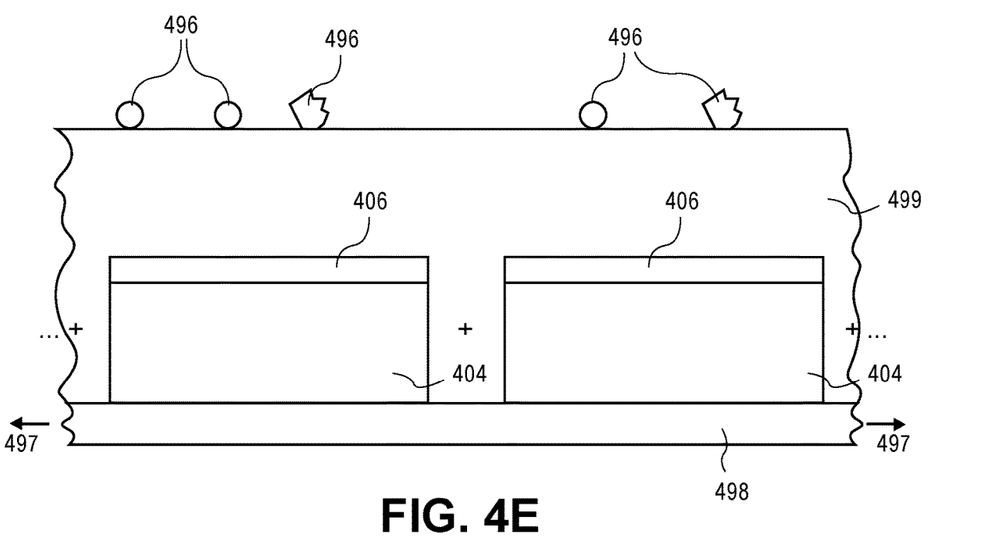

Referring to operation 310 of Flowchart 300, and corresponding FIG. 4E, the dicing tape 498 is expanded along opposing directions 497. A plurality of particles 496 is collected on the material layer 499 during the expanding of the dicing tape 498. In an embodiment, a source of the plurality of particles 496 is a portion of the wafer surrounding the plurality of singulated integrated circuits 406. For example, in one embodiment, a continuous portion of the wafer surrounding the plurality of singulated integrated circuits 406 is continuous such as remaining portion 199, described in association with FIG. 1. The continuous portion cracks or is broken during the expanding of dicing tape 498, generating particles 496.

Referring again to FIG. 4E, in a particular embodiment, an apparatus includes a plurality of singulated dies 406 disposed above a dicing tape 498. A water soluble material layer 499 is disposed over and between the plurality of singulated dies 406 above the dicing tape 498. A plurality of particles 496 is on the water soluble material layer 499. In one embodiment, the water soluble material layer 499 includes a material such as, but not limited to, polyvinyl alcohol, polyacrylic acid, dextran, polymethacrylic acid, polyethylene imine, or polyethylene oxide. In one embodiment, the apparatus further includes a water soluble mask (e.g., mask 402, not depicted in FIG. 4E) disposed on each of the plurality of singulated dies 406, the water soluble mask between a top surface of each of the plurality of singulated dies 406 and the water soluble material layer 499. In one embodiment, the dicing tape 498 is housed in a frame.

Figure 4F:
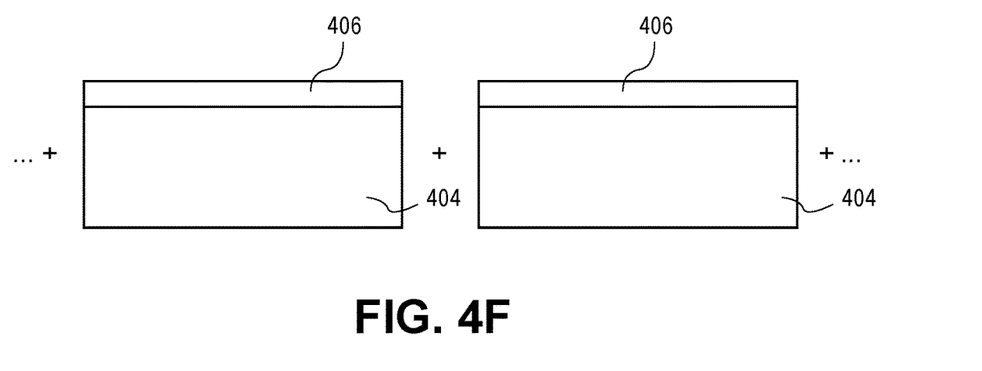

Referring to FIG. 4F, following expanding of the dicing tape 498, the material layer 499 and particles 496 are removed. In one embodiment, the material layer 499 and particles 496 are removed without allowing for the particles to contact the singulated dies 406, saving the singulated dies 406 from damage. The material layer 499 may be removed in preparation for a die pick process, where singulated dies 406 are removed from the expanded dicing tape.

In an embodiment, the material layer 499 and particles 496 are removed by a liquid medium. In one embodiment, the material layer 499 is a water soluble material layer, and the material layer 499 and the plurality of particles 496 are removed with an aqueous medium. In a particular such embodiment, the mask 402 formed pre-dicing is also a water soluble material, and both the water soluble mask 499 and remnants of the pre-dicing mask 402 are removed with the aqueous medium. In an embodiment, removal is achieved by dissolving in one or more of an alkaline solution, an acidic solution, or in deionized water. In an alternative embodiment, the material layer 499 is a non-water-soluble material layer, and is removed using an organic solvent.

Thus, one or more embodiments of the present invention include a wafer handling process first involving, subsequent to wafer dicing, the singulated dies remain on the dicing tape. A water soluble mask layer is formed on and over the singulated dies to ensure the water soluble material essentially fills into the die-to-die spacing area. In one embodiment, the water soluble layer is spin coated on, but can also be sprayed on. To ensure sufficient filling of mask into the gap between dies, a relatively low viscosity water soluble material may be used. The spin coating may be performed at relatively low speed to avoid die breakage. In one embodiment, after spin coating, the wafer is gently baked at low temperature (e.g., up to 50 C) to solidify the mask material. The process next involves expanding the dicing tape. Once the dicing tape is expanded, the water soluble mask is removed from the dies by an aqueous treatment subsequent drying treatment. The cleaned and dried singulated dies are ready to be picked for further assembly and/or testing.

Accordingly, referring again to Flowchart 300 and FIGS. 4A-4F, wafer dicing may be preformed by initial laser ablation through a mask layer, through wafer streets (including metallization), and partially into a silicon substrate. The laser pulse width may be selected in the femtosecond range. Die singulation may then be completed by subsequent through-silicon deep plasma etching. A water soluble material layer may then be disposed over the resulting singulated dies for protection from particles generated during a dicing tape expansion process. A specific example of a materials stack for dicing is described below in association with FIGS. 6A-6D, in accordance with an embodiment of the present invention.

Figure 6A:
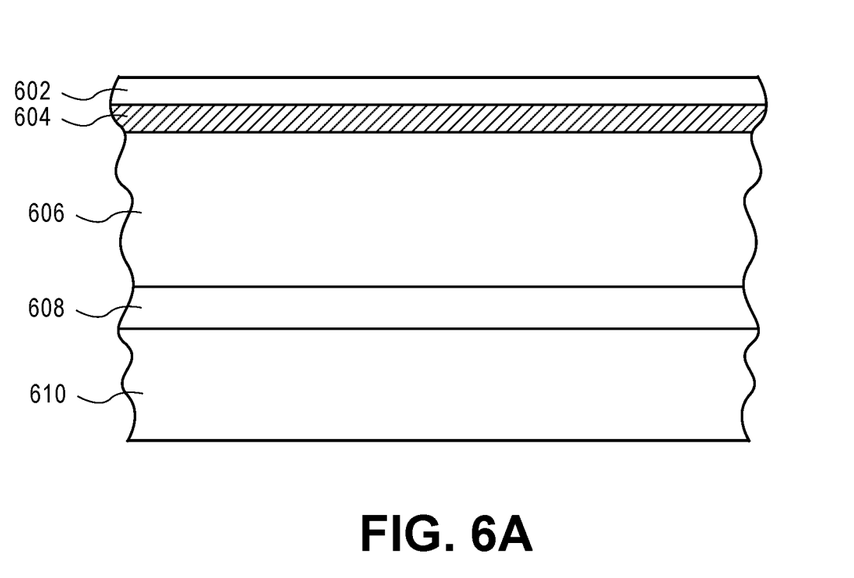
FIGS. 6A-6D illustrate cross-sectional views of various operations in a method of dicing a semiconductor wafer, in accordance with an embodiment of the present invention.

Referring to FIG. 6A, a materials stack for hybrid laser ablation and plasma etch dicing includes a mask layer 602, a device layer 604, and a substrate 606. The mask layer, device layer, and substrate are disposed above a die attach film 608 which is affixed to an underlying dicing or backing tape 610. In an embodiment, the mask layer 602 is a photo-resist layer such as the photo-resist layers described above in association with mask 402. In another embodiment, the mask 602 is a water-soluble mask. The device layer 604 includes an inorganic dielectric layer (such as silicon dioxide) disposed above one or more metal layers (such as copper layers) and one or more low K dielectric layers (such as carbon-doped oxide layers). The device layer 604 also includes streets arranged between integrated circuits, the streets including the same or similar layers to the integrated circuits. The substrate 606 is a bulk single-crystalline silicon substrate.

In an embodiment, the bulk single-crystalline silicon substrate 606 is thinned from the backside prior to being affixed to the die attach film 608. The thinning may be performed by a backside grind process. In one embodiment, the bulk single-crystalline silicon substrate 606 is thinned to a thickness approximately in the range of 50-100 microns. It is important to note that, in an embodiment, the thinning is performed prior to a laser ablation and plasma etch dicing process. In an embodiment, the photo-resist layer 602 has a thickness of approximately 5 microns and the device layer 604 has a thickness approximately in the range of 2-3 microns. In an embodiment, the die attach film 608 (or any suitable substitute capable of bonding a thinned or thin wafer or substrate to the backing tape 610) has a thickness of approximately 20 microns.

Figure 6B:
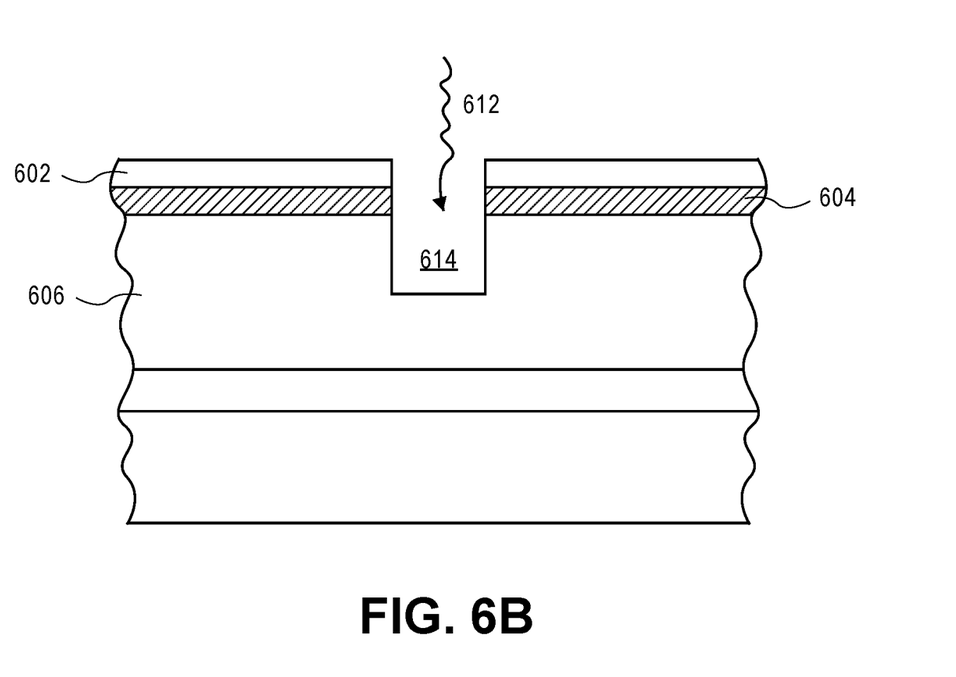

Referring to FIG. 6B, the mask 602, the device layer 604 and a portion of the substrate 606 are patterned with a femtosecond-based laser scribing process 612 to form trenches 614 in the substrate 606.

Figure 6C:
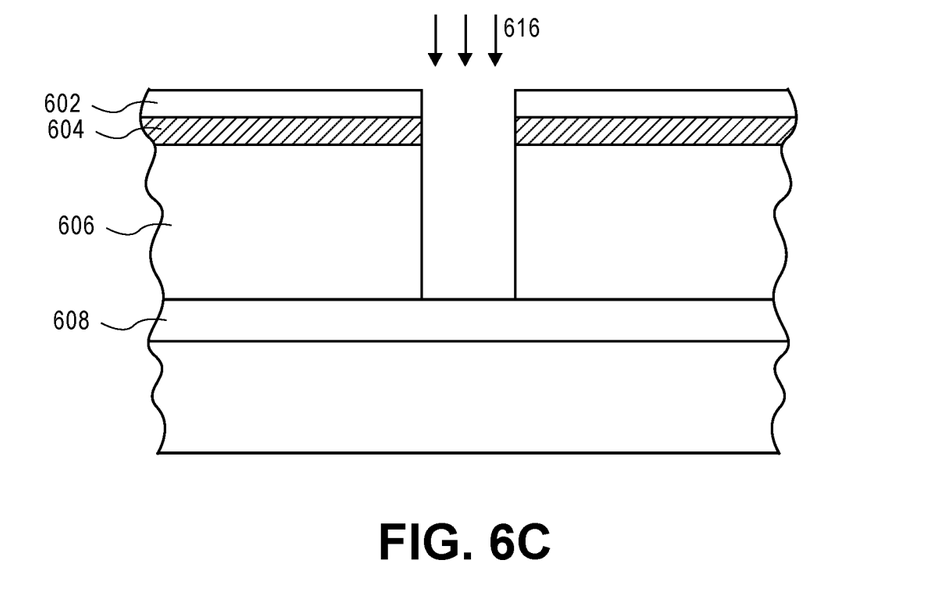

Referring to FIG. 6C, a through-silicon deep plasma etch process 616 is used to extend the trench 614 down to the die attach film 608, exposing the top portion of the die attach film 608 and singulating the silicon substrate 606. The device layer 604 is protected by the photo-resist layer 602 during the through-silicon deep plasma etch process 616.

Figure 6D:
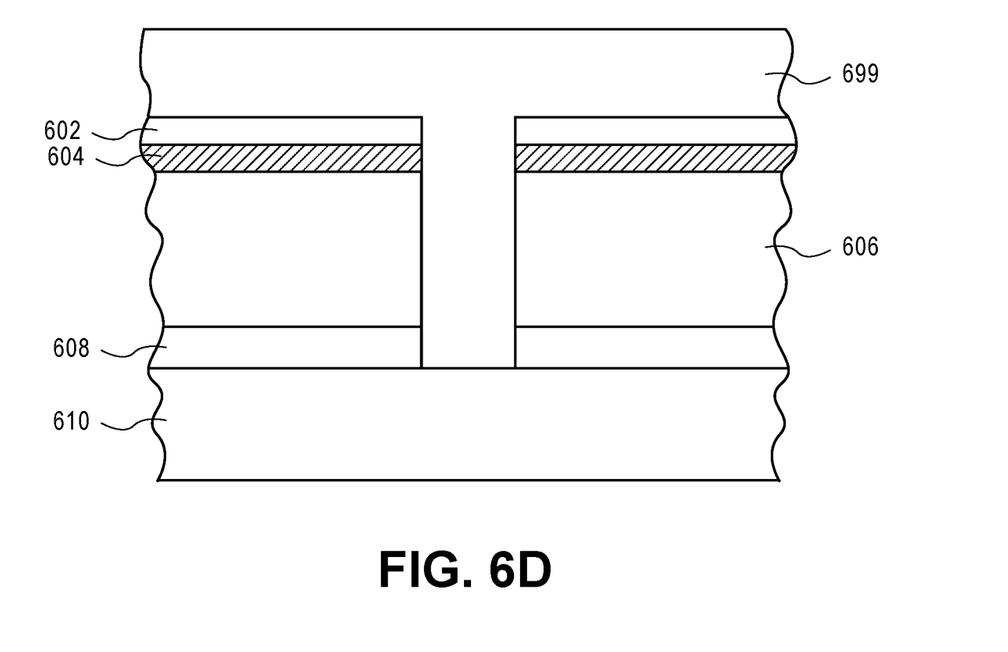

Referring to FIG. 6D, the singulation process may further include patterning the die attach film 908, exposing the top portion of the backing tape 610 and singulating the die attach film 608. In an embodiment, the die attach film is singulated by a laser process or by an etch process.

Whether or not the die attach film is patterned, in an embodiment, the singulated dies are covered with a water soluble material layer 699, as depicted in FIG. 6D. The water soluble material layer 699 may be used to collect particles generated during a dicing tape expansion process.

Further embodiments may include subsequently dissolving the water soluble material layer 699 in an aqueous medium and then removing the singulated portions of substrate 606 (e.g., as individual integrated circuits) from the backing tape 610. In one embodiment, a singulated die attach film 608 is retained on the back sides of the singulated portions of substrate 606. Other embodiments may include removing the masking layer 602 from the device layer 604. In an alternative embodiment, in the case that substrate 606 is thinner than approximately 50 microns, the laser ablation process 612 is used to completely singulate substrate 606 without the use of an additional plasma process.

In a particular embodiment encompassing aspects of FIGS. 4A-4F and FIGS. 6A-6D, a method of dicing a wafer having a plurality of integrated circuits thereon involves forming a water soluble mask layer above the wafer, the wafer disposed above a dicing tape, the dicing tape housed in a frame. The method also involves scribing the water soluble mask layer with a laser scribing process to expose portions of the wafer. The method also involves etching the exposed portions of the wafer with a plasma process to dice the wafer into a plurality of singulated dies. The method also involves forming a water soluble protecting layer over and between the plurality of singulated dies above the dicing tape. The method also involves removing the dicing tape from the frame. The method also involves, subsequent to removing the dicing tape from the frame, expanding the dicing tape, wherein a plurality of particles is collected on the water soluble material layer during the expanding. The method also involves, subsequent to expanding the dicing tape, removing the water soluble protecting layer and remaining portions of the water soluble mask layer with an aqueous medium.

In another aspect, referring again to FIGS. 4A-4F, the plurality of integrated circuits 406 may be separated by streets 407 having a width of approximately 10 microns or smaller. The use of a femtosecond-based laser scribing approach, at least in part due to the tight profile control of the laser, may enable such compaction in a layout of integrated circuits.

In yet another aspect, referring again to FIGS. 4A-4F, the plurality of integrated circuits 406 may be arranged on semiconductor wafer or substrate 404 in a non-restricted layout. In an embodiment, the speed of the laser ablation and plasma etch singulation process is independent of die size, layout or the number of streets.

In another aspect, a maskless-dicing approach is used for dicing, followed by the use of a protective mask during tape expansion and die pick. In an example, a conventional stealth dicing process does not involve mask coating (e.g., for plasma etch protection) or for protection during tape expansion. Instead, a bare wafer is subjected to laser irradiation to cause stealth damage, and tape expansion is performed along damaged lines to separate dies causing uncontrollable debris that may damage a die front surface.

In accordance with an embodiment of the present invention, a stealth dicing process is used as a mask-less singulation process. In one such embodiment, following the stealth dicing singulation where an internal damage line is generated, a protective mask coating is formed and tape expansion is then performed. In another such embodiment, prior to the stealth dicing singulation where an internal damage line is generated, a protective mask coating is formed and tape expansion is then performed. In either case, the protective mask coating protects the dies during tape expansion, and the protective mask coating is then removed along with debris caught thereon.

A single process tool may be configured to perform many or all of the operations in a hybrid laser ablation and plasma etch singulation process. For example, FIG. 7 illustrates a block diagram of a tool layout for laser and plasma dicing of wafers or substrates, in accordance with an embodiment of the present invention.

Figure 7:
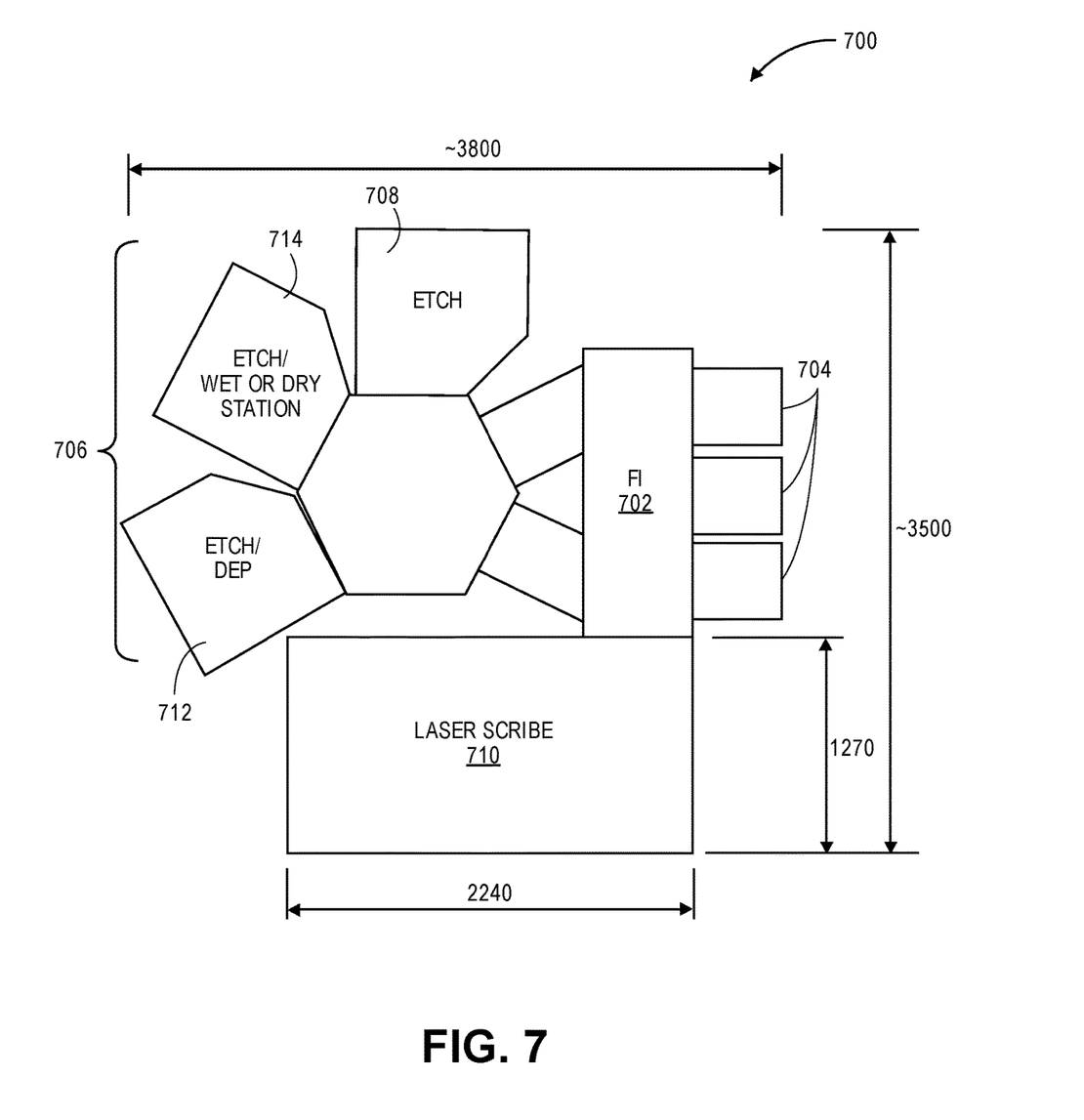
FIG. 7 illustrates a block diagram of a tool layout for laser and plasma dicing of wafers or substrates, in accordance with an embodiment of the present invention.

Referring to FIG. 7, a process tool 700 includes a factory interface 702 (FI) having a plurality of load locks 704 coupled therewith. A cluster tool 706 is coupled with the factory interface 702. The cluster tool 706 includes one or more plasma etch chambers, such as plasma etch chamber 708. A laser scribe apparatus 710 is also coupled to the factory interface 702. The overall footprint of the process tool 700 may be, in one embodiment, approximately 3500 millimeters (3.5 meters) by approximately 3800 millimeters (3.8 meters), as depicted in FIG. 7.

In an embodiment, the laser scribe apparatus 710 houses a femtosecond-based laser. The femtosecond-based laser is suitable for performing a laser ablation portion of a hybrid laser and etch singulation process, such as the laser abalation processes described above. In one embodiment, a moveable stage is also included in laser scribe apparatus 710, the moveable stage configured for moving a wafer or substrate (or a carrier thereof) relative to the femtosecond-based laser. In a specific embodiment, the femtosecond-based laser is also moveable. The overall footprint of the laser scribe apparatus 710 may be, in one embodiment, approximately 2240 millimeters by approximately 1270 millimeters, as depicted in FIG. 7.

In an embodiment, the one or more plasma etch chambers 708 is configured for etching a wafer or substrate through the gaps in a patterned mask to singulate a plurality of integrated circuits. In one such embodiment, the one or more plasma etch chambers 708 is configured to perform a deep silicon etch process. In a specific embodiment, the one or more plasma etch chambers 708 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 708 to facilitate high silicon etch rates. In an embodiment, more than one etch chamber is included in the cluster tool 706 portion of process tool 700 to enable high manufacturing throughput of the singulation or dicing process.

The factory interface 702 may be a suitable atmospheric port to interface between an outside manufacturing facility with laser scribe apparatus 710 and cluster tool 706. The factory interface 702 may include robots with arms or blades for transferring wafers (or carriers thereof) from storage units (such as front opening unified pods) into either cluster tool 706 or laser scribe apparatus 710, or both.

Cluster tool 706 may include other chambers suitable for performing functions in a method of singulation. For example, in one embodiment, in place of an additional etch chamber, a deposition chamber 712 is included. The deposition chamber 712 may be configured for water soluble material deposition, e.g., by spin coating, on and in between each of a plurality of singulated dies subsequent to dicing. In another embodiment, in place of an additional etch chamber, a wet/dry station 714 is included. The wet/dry station may be suitable for cleaning residues and fragments, or for removing a mask, subsequent to a laser scribe and plasma etch singulation process of a substrate or wafer. In an embodiment, a metrology station is also included as a component of process tool 700.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 700 described in association with FIG. 7. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 8:
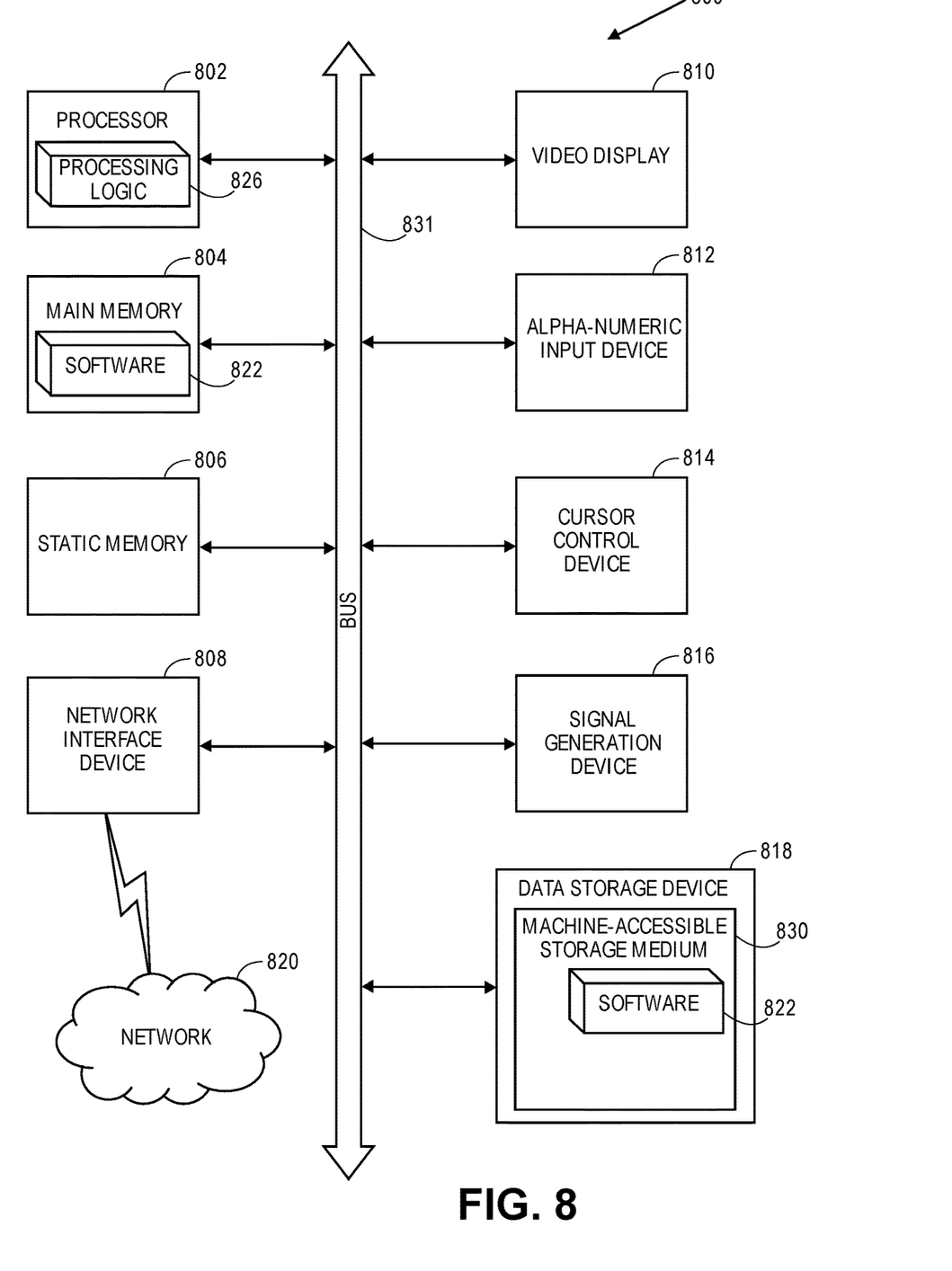
FIG. 8 illustrates a block diagram of an exemplary computer system, in accordance with an embodiment of the present invention.

FIG. 8 illustrates a diagrammatic representation of a machine in the exemplary form of a computer system 800 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 831.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations described herein.

The computer system 800 may further include a network interface device 808. The computer system 800 also may include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 830 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 830 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits. The method involves dicing a wafer into a plurality of singulated dies disposed above a dicing tape. The method also involves forming a water soluble material layer over and between the plurality of singulated dies above the dicing tape. The water soluble material and particles collected thereon is ultimately removed.

Thus, methods of dicing semiconductor wafers have been disclosed.

What is claimed is:

1. An apparatus, comprising:
a plurality of singulated dies disposed above a dicing tape;
a water soluble mask disposed on each of the plurality of singulated dies;
a water soluble material layer disposed over and between the plurality of singulated dies above the dicing tape, wherein the water soluble mask is between a top surface of each of the plurality of singulated dies and the water soluble material layer, and wherein the water soluble mask is separate and distinct from the water soluble material layer; and
a plurality of particles on the water soluble material layer.

2. The apparatus of claim 1, wherein the water soluble material layer comprises a material selected from the group consisting of polyvinyl alcohol, polyacrylic acid, dextran, polymethacrylic acid, polyethylene imine, and polyethylene oxide.

3. The apparatus of claim 1, wherein the dicing tape is housed in a frame.

4. An apparatus, comprising:
a plurality of singulated dies disposed above an expanded dicing tape;
a water soluble mask disposed on each of the plurality of singulated dies;
a water soluble material layer disposed over and between the plurality of singulated dies above the expanded dicing tape, wherein the water soluble mask is between a top surface of each of the plurality of singulated dies and the water soluble material layer, and wherein the water soluble mask is separate and distinct from the water soluble material layer; and
a plurality of particles on the water soluble material layer.

5. The apparatus of claim 4, wherein the water soluble material layer comprises a material selected from the group consisting of polyvinyl alcohol, polyacrylic acid, dextran, polymethacrylic acid, polyethylene imine, and polyethylene oxide.

* * * * *